(12) United States Patent
Yoon et al.

(10) Patent No.: US 8,665,405 B2
(45) Date of Patent: Mar. 4, 2014

(54) THIN FILM TRANSISTOR ARRAY PANEL

(75) Inventors: Yeo-Geon Yoon, Seoul (KR);
Hyoung-Wook Lee, Asan-si (KR);
Mi-Ae Lee, Cheonan-si (KR); Ho-Jun Lee, Anyang-si (KR)

(73) Assignee: Samsung Display Co., Ltd. (KR)

( * ) Notice: Subject to any disclaimer, the term of this patent is extended or adjusted under 35 U.S.C. 154(b) by 301 days.

(21) Appl. No.: 13/072,962

(22) Filed: Mar. 28, 2011

(65) Prior Publication Data

US 2012/0007082 A1 Jan. 12, 2012

(30) Foreign Application Priority Data

Jul. 9, 2010 (KR) ........................ 10-2010-0066388

(51) Int. Cl.
*G02F 1/1343* (2006.01)
*G02F 1/136* (2006.01)

(52) U.S. Cl.
USPC ................. 349/143; 349/43; 349/45; 349/48; 349/139

(58) Field of Classification Search
USPC .................. 349/42, 43, 45, 48, 139, 143, 144
See application file for complete search history.

(56) References Cited

U.S. PATENT DOCUMENTS

| | | | |
|---|---|---|---|
| 7,511,791 B2 | 3/2009 | Hong | |
| 7,852,437 B2 * | 12/2010 | Lee et al. | 349/108 |
| 7,924,387 B2 * | 4/2011 | Hung | 349/144 |
| 8,077,285 B2 * | 12/2011 | Hung | 349/144 |
| 2007/0216619 A1 * | 9/2007 | Hung | 345/87 |
| 2008/0100760 A1 * | 5/2008 | Lee et al. | 349/37 |
| 2011/0149225 A1 * | 6/2011 | Hung | 349/144 |
| 2012/0007082 A1 * | 1/2012 | Yoon et al. | 257/59 |

FOREIGN PATENT DOCUMENTS

| | | | |
|---|---|---|---|
| JP | 08062582 A | 3/1996 | |
| JP | 2000241830 A | 9/2000 | |
| JP | 2008020613 A | 1/2008 | |
| JP | 2008165230 A | 7/2008 | |
| JP | 2008293031 A | 12/2008 | |
| JP | 2009151328 A | 7/2009 | |
| KR | 100464206 B | 12/2004 | |
| KR | 1020060114918 A | 11/2006 | |
| KR | 1020070051037 A | 5/2007 | |
| KR | 1020080083811 A | 9/2008 | |
| KR | 1020090005862 A | 1/2009 | |
| KR | 1020090060082 A | 6/2009 | |

* cited by examiner

*Primary Examiner* — Rhonda Peace
(74) *Attorney, Agent, or Firm* — Cantor Colburn LLP

(57) ABSTRACT

A thin film transistor array panel includes an insulating substrate, a plurality of pixel electrodes arranged on the insulating substrate in rows and columns, a plurality of thin film transistors connected with the plurality of pixel electrodes, respectively, and a plurality of gate lines and a plurality of data lines connected with the plurality of thin film transistors. When one data line and one pixel electrode which are connected with a single thin film transistor are referred to as a connected data line and a connected pixel electrode, respectively, the plurality of thin film transistors are positioned on a same side of the connected data line in two adjacent rows, and on alternating sides of the connected data line in every other two adjacent rows. Two boundary lines of the connected pixel electrode are overlapped with the connected data line.

17 Claims, 6 Drawing Sheets

THIN FILM TRANSISTOR ARRAY PANEL

This application claims priority to Korean Patent Application No. 10-2010-006638filed on Jul. 9, 2010, and all the benefits accruing therefrom under ¡119, the entire contents of which are incorporated herein by reference.

BACKGROUND OF THE INVENTION (a) Field of the Invention

The invention relates to a thin film transistor array panel, and more particularly, to a thin film transistor array panel for a liquid crystal display.

(b) Description of the Related Art

A liquid crystal display as one of flat panel display devices that are widely being used. The liquid crystal display includes two display panels where a field generating electrode such as a pixel electrode and a common electrode is formed, and a liquid crystal layer is interposed therebetween. The liquid crystal display generates an electric field on the liquid crystal layer by applying voltage to the field generating electrode, to determine orientations of liquid crystal molecules of the liquid crystal layer and control polarization of incident light, thereby displaying images.

In such a liquid crystal display, an electric field is generated on the liquid crystal layer by applying voltage to two electrodes, and transmittance of light passing through the liquid crystal layer is affected by adjusting the intensity of the electric field, thereby acquiring desired images. In order to prevent deterioration, flickering, or the like from being generated by applying the electric field to the liquid crystal layer in one direction for a long time, the polarity of data voltage to common voltage is inverted for each frame, row, column, or pixel.

Among various methods of inverting the polarity of the data voltage, a method using an odd row and an even row that are vertically adjacent to each other as one inversion unit, that is, a 2×1 dot inversion driving method (hereinafter, referred to as 'dot inversion driving method') is being developed. That is, an odd row and an even row that constitute an inversion unit have the same polarity.

BRIEF SUMMARY OF THE INVENTION

In an exemplary embodiment, an inversion unit includes pixels in adjacent rows. A signal is applied to an opposite side of the inversion unit of every other two adjacent rows on the basis of a data line in order to implement 2-dot inversion driving. In this case, respective distances between first and second-row pixel electrodes and the data line, may be different from respective distances between third and fourth-row pixel electrodes and the same data line.

That is, distances between the pixel electrodes and the data line should be arranged to be the same as each other, but misalignment in a manufacturing process may occur, and the distance between the pixel electrode and the data line is changed due to the misalignment. Such a distance difference causes a horizontal line error in which a parasite capacitance difference is generated between the pixel electrode and the data line.

The invention has been made in an effort to provide a thin film transistor array panel having advantages of reducing or effectively preventing a horizontal line error from being generated by minimizing a parasite capacitance difference.

An exemplary embodiment of the invention provides a thin film transistor array panel that includes an insulating substrate, a plurality of pixel electrodes arranged on the insulating substrate in rows and columns, a plurality of thin film transistors connected with the plurality of pixel electrodes, respectively, and a plurality of gate lines and a plurality of data lines connected with the plurality of thin film transistors. When one data line and one pixel electrode which are connected with one thin film transistor are referred to as a connected data line and a connected pixel electrode, respectively, the plurality of thin film transistors are on a same side of the connected data line in two adjacent rows, and on alternating sides of the connected data line in other two adjacent rows, and two boundary lines of the connected pixel electrode are overlapped with the connected data line.

The connected data line includes a first vertical section which is overlapped with the connected pixel electrode positioned at the left side s of the connected data line, a second vertical section which is overlapped with the connected pixel electrode positioned at the right side of the connected data line, and a horizontal section connecting the second vertical section with the first vertical section.

The horizontal section may be positioned between groups of two adjacent rows.

The connected data line may not be overlapped with a pixel electrode which is connected with a data line adjacent to the connected data line.

The thin film transistor array panel may further include a passivation layer positioned between the pixel electrode and the data line. The passivation layer may be made of an organic insulator.

The passivation layer may have a thickness of micrometers (μm) or more.

The pixel electrode may be positioned on a straight line in a column direction.

The thin film transistor array panel may further include a sustain electrode overlapped with the data line and having a width larger than the data line.

The thin film transistor array panel further includes a passivation layer positioned between the pixel electrode and the data line. The passivation layer is made of an organic insulator.

Another exemplary embodiment of the invention provides a thin film transistor array panel that includes an insulating substrate, a single unitary indivisible pixel electrode including a first subpixel electrode and a second subpixel electrode on the insulating substrate, a thin film transistor directly connected with the first subpixel electrode or the second subpixel electrode of the pixel electrode, and a gate line and a data line connected with the thin film transistor. The first subpixel electrode and the second subpixel electrode are positioned in a diagonal direction on the basis of the data line in a plan view of the insulating substrate. The first subpixel electrode and the second subpixel electrode are connected to each other by a connector crossing the data line.

The first subpixel electrode and the second subpixel electrode of a color which connected by the connector, may correspond to color filters of the same color.

The first subpixel electrode and second subpixel electrodes which are adjacent to each other on the basis of the connector, and two other subpixel electrodes adjacent to the connector but not connected with the connector may constitute an electrode group. The two other subpixel electrodes which are not connected with the connector in the electrode group, may correspond to different colors.

The first subpixel electrode and the second subpixel electrode connected by the connector may correspond to any one of red, green, and blue color filters. The two other subpixel electrodes which are not connected by the connector may correspond to the remaining two color filters other than color filters corresponding to the first subpixel electrode and the second subpixel electrode connected by the connector.

The thin film transistor array panel further includes a passivation layer positioned between the pixel electrode and the data line. The passivation layer is made of an organic insulator.

The passivation layer may have a thickness of μm or more.

The thin film transistor array panel may further include a sustain electrode line positioned between the first subpixel electrode and the second subpixel electrode.

The thin film transistor array panel may further include a sustain electrode overlapped with the data line, and having a width larger than the data line.

The first subpixel electrode and the second subpixel electrode connected by the connector may correspond to color filters of the same color.

According to the exemplary embodiments of the invention, when a passivation layer includes an organic insulator and a data line is overlapped with a pixel electrode, it is possible to acquire a uniform parasite capacitance throughout a substrate.

Further, by positioning and connecting the pixel electrode diagonally on the basis of the data line, it is possible to acquire the uniform parasite capacitance throughout the substrate.

Accordingly, a horizontal line error which is generated due to a parasite capacitance difference, does not occur.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION OF THE INVENTION

Figure 1:
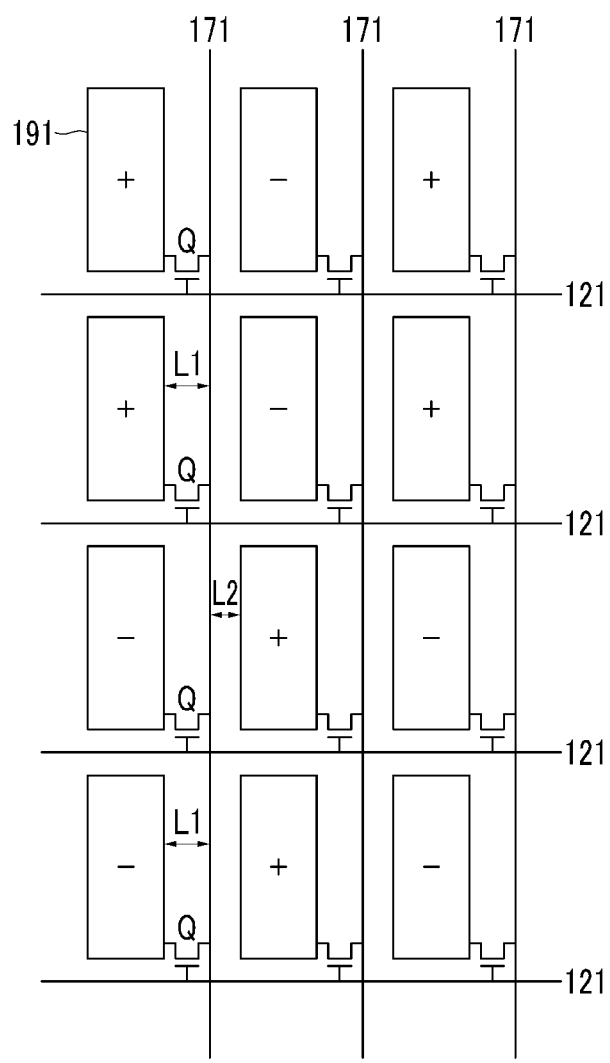
FIG. 1 is a schematic plan view of an exemplary embodiment of a thin film transistor array panel, according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items.

It will be understood that when an element such as a layer, film, region, or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, "connected" refers to physically and/or electrical connection.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. is a schematic plan view of an exemplary embodiment of a thin film transistor array panel, according to the invention.

As shown in FIG. 1, a gate line 12elongates in a horizontal (e.g., first or row) direction, and a data line 17which crosses the gate line 12elongates in a vertical (e.g., second or column) direction.

In addition, a thin film transistor Q is connected to both the gate line 12and the data line 171. The thin film transistor Q is connected with a pixel electrode 191. The thin film transistor Q is connected to the pixel electrode 19of an opposite polarity thereto in alternating groups of two rows relative to a longitudinal direction of the data line 171. The pixel electrode 19does not overlap the data line 171.

The pixel electrode 19is in a pixel of the thin film transistor array panel. The pixel may be defined as an independent area unit capable of independently controlling light transmittance, such as by controlling liquid crystal. In an exemplary embodiment, the pixels may correspond to color filters of a panel opposing the thin film transistor array panel. As used herein, "corresponding" may refer to as relating or aligned in quantity, shape, dimensions or positional placement relative to another element.

A group of the pixel electrode 19has a same polarity. As illustrated in FIG. 1, a pixel electrode group includes two pixel electrodes 19or two pixels, in two directly adjacent pixel electrode rows. Adjacent pixel groups have different polarities from each other in the column direction. Along an extension direction of the data lines 17(e.g., the column direction), and/or along an extension direction of the gate lines 12(e.g., the row direction) pixel electrode groups having different polarities may be arranged alternately. The pixel electrodes 19in the pixel groups of one pixel column are each connected to the same data line 171, as illustrated in FIG. 1.

Accordingly, voltage of a same polarity in every other group of two adjacent pixel electrode rows, such as +, +, −, −, +, +. . . , is applied to the pixel electrodes 191 in pixels of one pixel electrode column which extends in the column direction along the data line 171.

In the plan view, gaps L and L between edges of the data line 171 and the pixel electrodes 191 which are positioned at the left and right sides of the data line 171, respectively, may be different from each other. FIG. 1 illustrates a misalignment which may occur in a manufacturing process in order to further describe an exemplary embodiment of the invention. It is preferable that the misalignment does not actually occur.

A structure and an interlayer configuration of one pixel in a thin film transistor array panel having a pixel arrangement, will be described in detail with reference to FIGS. 2 and 3.

Figure 2:
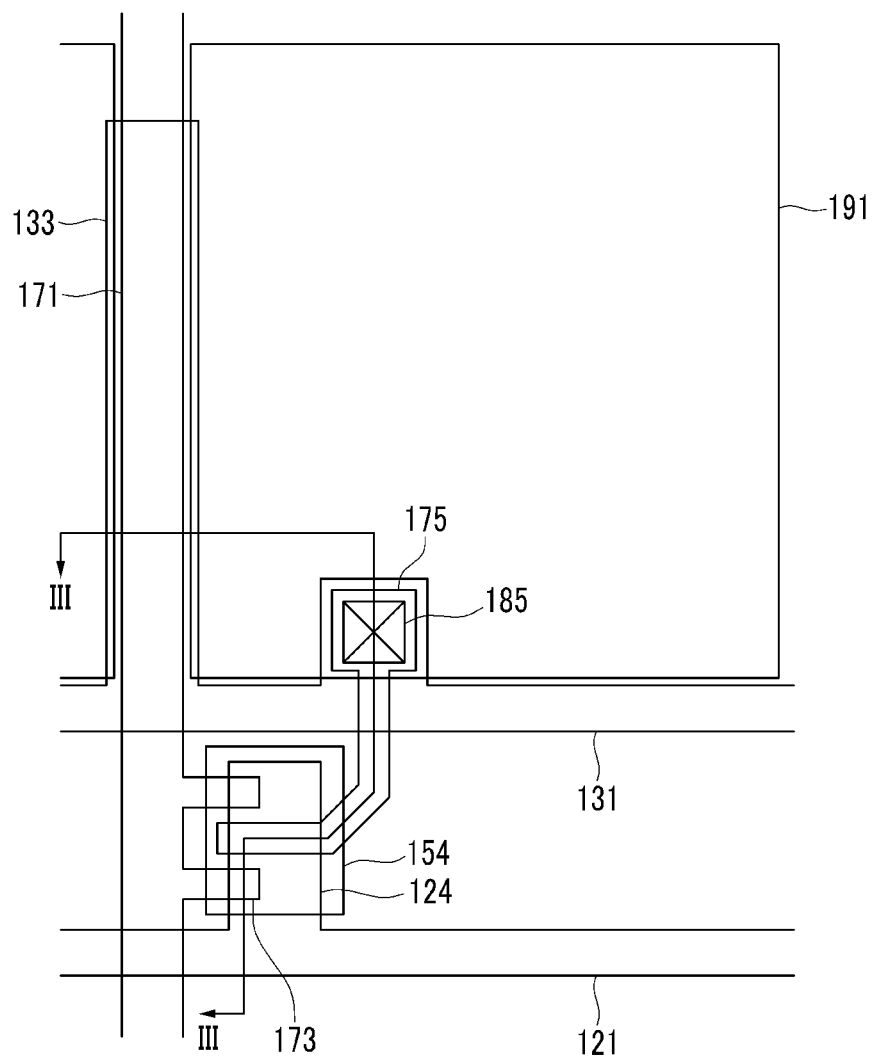
FIG. 2 is a plan view of an exemplary embodiment of one pixel of a thin film transistor array panel, according to the invention.

FIG. 2 is a plan view of one pixel of a thin film transistor array panel, according to the invention and FIG. is a cross-sectional view taken along line III-III of FIG. 2.

As shown in FIG. 2, a plurality of the gate line 121 and a plurality of a sustain electrode line 131 transferring a gate signal, are positioned on an insulating substrate 110. The insulating substrate 110 may include transparent glass, and the like. Each gate line 121 extends in a horizontal direction in the plan view, and includes a gate electrode 124. In addition, the sustain electrode line 131 extends in the same direction as the gate line 121, and includes a plurality of a sustain electrode 133 that each extend in a vertical direction in the plan view.

A gate insulating layer 140 is directly on the gate line 121.

An intrinsic semiconductor 154 including amorphous silicon is directly on the gate insulating layer 140. Ohmic contacts 163 and 165 which include silicide or n+hydrogenated amorphous silicon doped with n-type impurities with high concentration, are directly on the intrinsic semiconductor 154. The intrinsic semiconductor 154 may be collectively referred to as a semiconductor together with the ohmic contacts 163 and 165. The semiconductor may collectively include the intrinsic semiconductor and ohmic contact layers, and define a polysilicon semiconductor or an oxide semiconductor.

The plurality of data lines 171 and a plurality of drain electrode 175 are positioned on the ohmic contacts 163 and 165.

The data lines 171 extend in the vertical direction to cross the gate lines 121, and transfer data voltage. Each data line 171 includes a source electrode 173 continuously extending therefrom. The drain electrode 17faces the source electrode 173 on the gate electrode 124.

The sustain electrode 133 is positioned below the data line 171, such that the data line 171 is between the insulating substrate 11and the sustain electrode 133. The sustain electrode 133 has a width in the horizontal direction larger than a width of the data line 171, to block light leakage generated between the data lines 171. In an alternative embodiment, the sustain electrode 133 may include portions separated from each other positioned adjacent to edges of the data line 171 and as necessary, may be configured in various forms.

The gate electrode 124, the source electrode 173, and the drain electrode 175 collectively constitute the thin film transistor TFT together with the intrinsic semiconductor 154. A channel of the thin film transistor is defined in a channel part of the intrinsic semiconductor 154, between the source electrode 173 and the drain electrode 175 which are separated from each other relative to the gate electrode 124.

A passivation layer 180 is directly on and contacts the gate insulating layer 140, the data line 171, the drain electrode 175, and the channel of the intrinsic semiconductor 154.

The passivation layer 180 includes an organic insulator having a low dielectric constant. The organic insulator preferably has a dielectric constant of 4.0or lower, and may have photosensitivity. The passivation layer 180 has a thickness of 2 micrometers (μm) or more, and defines a sufficient gap taken from a layer (e.g., the pixel electrode 191) that is positioned on the data line 171 and the passivation layer 180. As a result, it is possible to sufficiently decrease the magnitude of a parasite capacitance coupled with the data line 171.

When the passivation layer 180 includes the organic insulator of the low dielectric constant, gaps L1 and L2 (FIG. 1) between the data line 171 and two respective adjacent pixel electrodes 191 are different from each other. Thus, parasite capacitances C1 and C2 between the data line 171 and two respective adjacent pixel electrodes 191 are different from each other, but the magnitude is small. Since a difference between the parasite capacitances is not large, a horizontal pattern due to the parasite capacitance is reduced.

The parasite capacitance is in inverse proportion to the distances L1 and L2 between the pixel electrodes 191 and the data line 171, and the parasite capacitance is in proportion to a dielectric constant. In the exemplary embodiment where the passivation layer 180 includes the organic insulator, distances between the pixel electrodes 191 and the data line 171 are increased and the dielectric constant is low in comparison with a case in which the passivation layer 180 according to an exemplary embodiment of the invention includes an inorganic insulator, thereby reducing the parasite capacitance. Therefore, where the passivation layer 180 includes the organic insulator of the low dielectric constant, the parasite capacitance difference which is generated by the misalignment is small enough to be negligible, and the horizontal pattern which is generated due to the capacitance difference is reduced.

A contact hole 185 which exposes a part of the drain electrode 171 is extended completely through a thickness the passivation layer 180.

The pixel electrode 191 is positioned on the passivation layer 180, the pixel electrode 191 is physically and electrically connected with the drain electrode 175 through the contact hole 185, and the data voltage is applied from the data line 171 to the pixel electrode 191.

Figure 4:
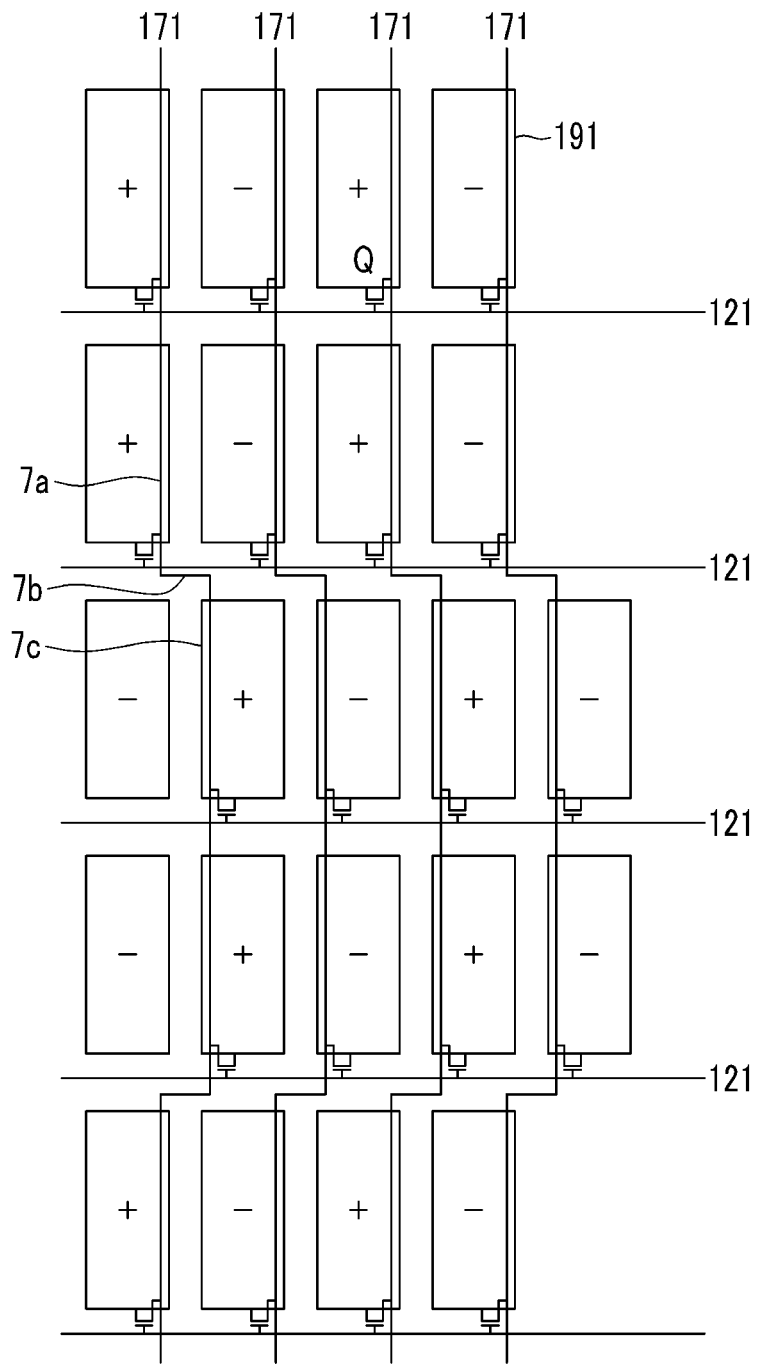
FIG. 4 is a schematic plan view of another exemplary embodiment of a thin film transistor array panel, according to the invention.

FIG. 4 is a schematic plan view of another exemplary embodiment of a thin film transistor array panel, according to the invention, and FIG. is a cross-sectional view taken along a cut line which perpendicularly cuts a data line of the thin film transistor array panel of FIG. 4.

Figure 3:
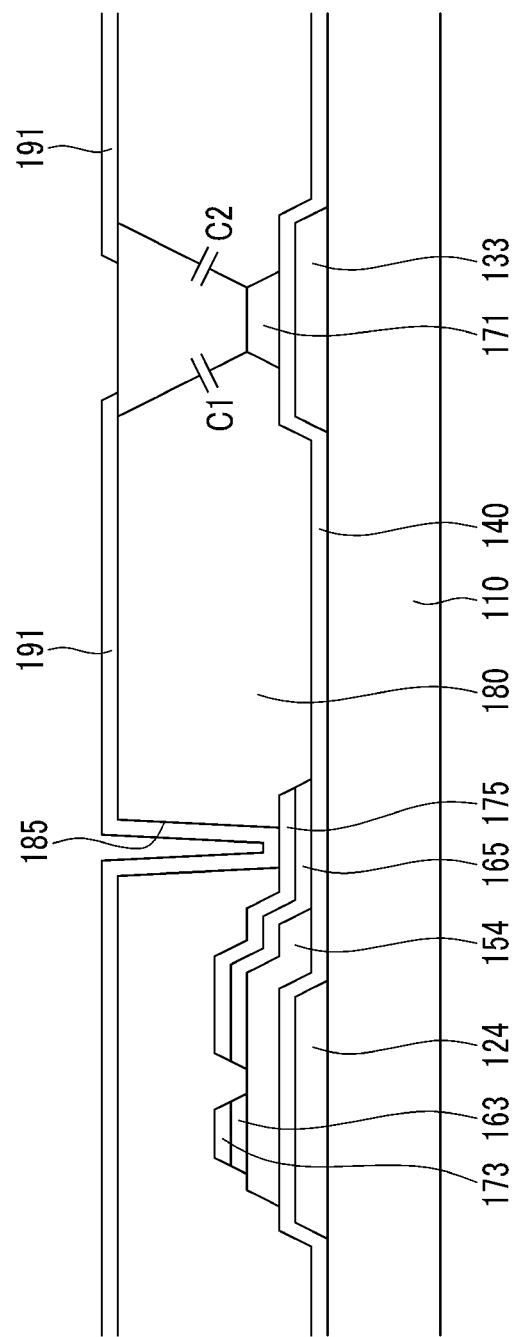
FIG. 3 is a cross-sectional view taken along line III-III of FIG. 2.

The thin film transistor array panel of FIG. has substantially the same layout as the thin film transistor array panel of FIGS. 1 and 2 has substantially the same interlayer structure as FIG. 3. Therefore, only different parts will be described in detail.

As shown in FIG. 4, the gate line 12elongates on a substrate in the horizontal (e.g., row) direction, and the data line 17which crosses the gate line 121 elongates in the vertical (e.g., column) direction and has a structure in which the data line 12is repetitively bent along the vertical direction in the plan view.

In addition, the thin film transistor Q is connected to the gate line 12and the data line 171. The thin film transistor Q is connected with the pixel electrode 191. The thin film transistor Q is connected to the pixel electrode 191 of an opposite direction thereto relative to the data line 171 in every two rows.

However, in the thin film transistor array panel of FIG. unlike the thin film transistor array panel of FIG. 1, the data line 171 is overlapped with the corresponding pixel electrode 191. Herein, the relationship between the data line 171 and the corresponding pixel electrode 191 is a pixel electrode which receives data voltage applied to the data line 171. Hereinafter, a pixel electrode 191 which is connected with a specific one data line 171 in FIG. to receive the data voltage is referred to as a connected pixel electrode 191. A pixel electrode 191 which is not connected with the one data line 171 is referred to as a non-connected pixel electrode 191.

As shown in FIG. 4, pixel electrodes 191 are arranged rows and columns, and are positioned on a straight line (e.g., aligned linearly) in the column direction. Each of the data lines 171 includes a first vertical section 7a which is overlapped with the connected pixel electrode 191 positioned at the left side relative to the each data line 171, a second vertical section 7c which is overlapped with the connected pixel electrode 191 positioned at the right side relative to the each data line 171, and a horizontal section 7b connecting the second vertical section 7c with the first vertical section 7a. When the each data line 171 in FIG. 4 is overlapped with the connected pixel electrode 191 having the same polarity as the each data line 171, the each data line 171 is not overlapped with a non-connected pixel electrode to which an opposite polarity is applied.

The first vertical section 7a, the second vertical section 7c and the horizontal section 7b collectively form a single unitary and indivisible data line 171.

Figure 5:
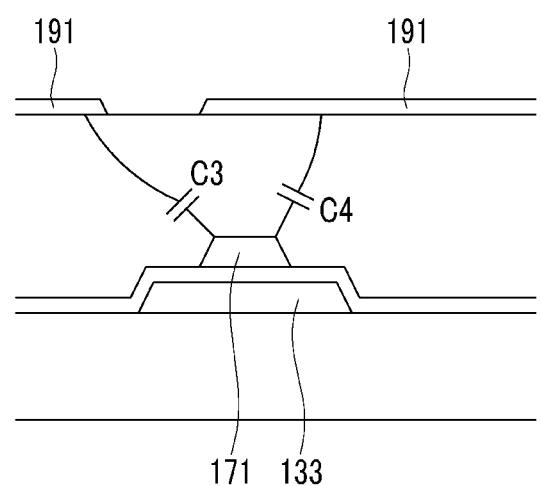
FIG. 5 is a cross-sectional view taken along a cut line which perpendicularly cuts a data line of the thin film transistor array panel of FIG. 4.

Like this, when the each data line 171 in FIG. 4 is overlapped with the connected pixel electrode 191, parasite capacitance C3 which is generated between the each data line 171 and an adjacent pixel electrode 191 which is not overlapped with the each data line 171 is negligible. That is, as shown in FIG. 5, since a distance between the non-connected pixel electrode 191 and the data line 17that are adjacent to each other, is further than a distance between the data line 171 and the connected pixel electrode 191 which is overlapped with the data line 171, little parasite capacitance between the non-connected pixel electrode 191 and the data line 171 that are adjacent to each other occurs.

Accordingly, since only a parasite capacitance C4 generated between the connected pixel electrode 191 overlapped with the data line influences the luminance of the connected pixel electrode, and since areas of the connected pixel electrode and the data line 171 which are overlapped with each other are the same as each other throughout the substrate, it is possible to acquire the same parasite capacitance C4.

As illustrated in FIG. 4, the data line 171 overlaps an entire of a length of the connected pixel electrode 191 in the column direction. A boundary line of the data line 171 is positioned inside of a boundary line of the connected pixel electrode 191 by a process error by considering the process error. Therefore, although the misalignment occurs, the data line 171 is positioned within the boundary line of the connected pixel electrode 191 to be fully overlapped with a length of the pixel electrode 191, and as a result, the same parasite capacitance occurs at all times.

As described above, when the connected pixel electrode 191 and the data line 171 are overlapped with each other as shown in FIG. 4, uniform parasite capacitance can be, at all times, acquired throughout the array panel. Therefore, it is possible to reduce the horizontal line error due to the parasite capacitance difference.

Since the data line 171 and a length of the connected pixel electrode 19are fully overlapped with each other, the parasite capacitance may be further increased in comparison with the known case in which the data line 171 and the connected pixel electrode 191 are just partially overlapped with each other. However, referring to FIG. 3, the sustain electrode 133 is positioned below the data line 171 to reduce the parasite capacitance due to a shielding effect and in addition, the thickness of the passivation layer 180 increases to thereby reduce the parasite capacitance.

Further, the passivation layer 180 of the thin film transistor array panel of FIG. 4 is also made of the same material as the passivation layer of FIG. and may have a thickness of 2 μm or more.

Figure 6:
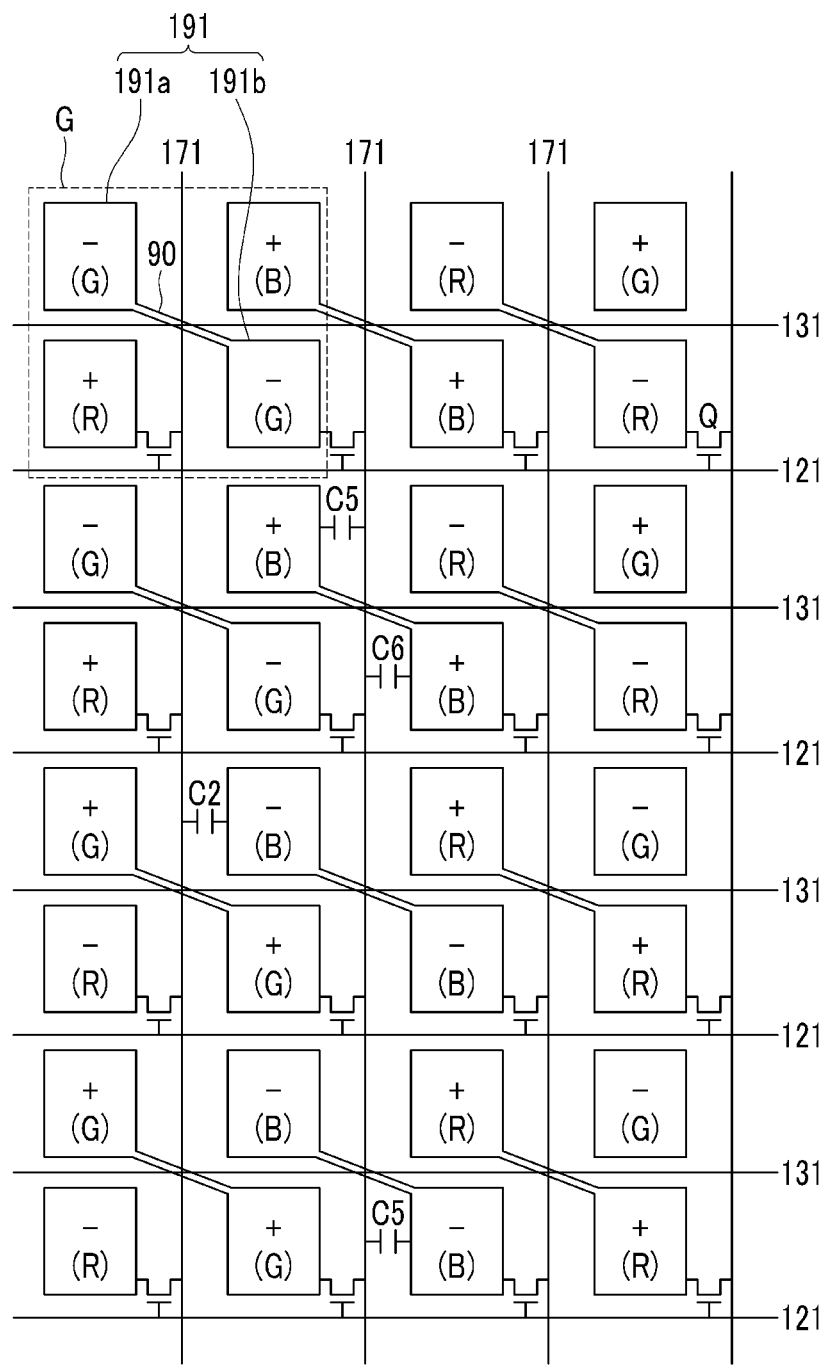
FIG. 6 is a plan view of another exemplary embodiment of a thin film transistor array panel, according to the invention.

FIG. 6 is a plan view of another exemplary embodiment of a thin film transistor array panel, according to the invention.

Since the interlayer structure of the thin film transistor array panel of FIG. 6 is the same as that of the thin film transistor array panel of FIGS. 2 and 3, only different parts will be described in detail.

In the thin film transistor array panel of FIG. 6, the gate line 12and the sustain electrode line 131 are positioned alternately with each other in a column direction, and the data line 171 which crosses both the gate line 121 and the sustain electrode line 131, are on a substrate. The gate line 121 and the data line 171 are connected with the thin film transistor Q, and the thin film transistor Q is connected with thHe pixel electrode 191. The pixel electrodes 191 may include red (R), green (G), and blue (B) pixel electrodes 191.

However, one pixel electrode 191 of FIG. 6 includes a first subpixel electrode 191a and a second subpixel electrode 191b in separate pixels from each, other unlike the pixel electrode 191 of FIG. which is entirely disposed in one pixel. The first subpixel electrode 191a and the second subpixel electrode 191b are positioned diagonally to each other in the plan view, relative to one data line 171. The first subpixel electrode 191a and the second subpixel electrode 191b are physically and electrically connected to each other via a connector 9crossing the one data line 171.

Like this, when one pixel electrode 19including two portions is positioned diagonally relative to the one data line 171, parasite capacitance (the sum of Cand C6) formed between the pixel electrodes and the data lines have the same value as each other.

That is, since the first subpixel electrode 191a and the second subpixel electrode 191b are positioned opposite to each other relative to the data line 171, the first parasite capacitance Cbetween the first subpixel electrode 191a and the one data line 171, and the second parasite capacitance Cbetween the second subpixel electrode 191b and the one data line 171 have different values from each other. However, the parasite capacitance of one single unitary pixel electrode 19is the sum of the first parasite capacitance Cand the second parasite capacitance C6. Since all the pixel electrodes 191 include the first parasite capacitance Cand the second parasite capacitance C6, the parasite capacitances of all the pixels on the substrate may have the same value as each other.

Since light leakage may occur between the first subpixel electrode 191a and the second subpixel electrode 191b, the sustain electrode 133 may be disposed between the first subpixel electrode 191a and the second subpixel electrode 191b.

The thin film transistor array panel of FIG. may further include a color filter and the color filter may include red (R), green (G), and blue (B) color filters. Color filters of a color are positioned in the pixels including the first subpixel electrode 191a and the second subpixel electrode 191b of the same color that are connected by the respective connector 90.

Four adjacent subpixel electrodes collectively form an electrode group G relative to the connector 90. Two subpixel electrodes of the four adjacent subpixel electrodes which are not connected with the connector 90 in the electrode group G, represent different colors from the remaining two subpixel electrodes that are connected by the connector 90. As illustrated in FIG. 6, when the green color filter G is positioned in the pixels including the first subpixel electrode 191a and the second subpixel electrode 191b that are connected by the connector 90 in the electrode group G, the red color filter R and the blue color filter B are positioned in the pixels including the remaining two subpixel electrodes, respectively. Further, in FIG. 6, the data voltage which is firstly transferred to the second subpixel electrode 191b through the data line 171 has a structure in which the data voltage is finally applied to the first subpixel electrode 191a through the connector 90 from the second subpixel electrode 191b.

However, unlike this, the thin film transistor Q may be connected with the data line which is overlapped with the connector 90, the data voltage may be firstly applied to the first subpixel electrode 191a, and the data voltage is finally applied to the second subpixel electrode 191b through the connector 9from the first subpixel electrode 191a.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
an insulating substrate;
a plurality of pixel electrodes arranged on the insulating substrate in rows extending in a row direction, and columns extending in a column direction;
a plurality of thin film transistors connected with the plurality of pixel electrodes, respectively; and
a plurality of gate lines, and one data line connected with the plurality of thin film transistors,
wherein
two first thin film transistors among the plurality of thin film transistors connected with the one data line, in two first adjacent rows, are connected to two first pixel electrodes in a first column,
two second thin film transistors among the plurality of thin film transistors connected with the one data line, in two second adjacent rows adjacent to the two first adjacent rows, are connected to two second pixel electrodes in a second column adjacent to the first column,
the two first thin film transistors and the two second thin film transistors connected with the one data line, are repeated in the column direction, and
two boundary lines opposite to each other in the column direction, of the two first pixel electrodes in the first column and the two second pixel electrodes in the second column, are overlapped with the one data line.

2. The thin film transistor array panel of claim 1, wherein the one data line includes:
a first vertical section which is overlapped with the two first pixel electrodes in the first column,
a second vertical section which is overlapped with the two second pixel electrodes in the second column, and
a horizontal section which connects the second vertical section with the first vertical section, the horizontal section between the two first adjacent rows and the two second adjacent rows.

3. The thin film transistor array panel of claim 2, wherein the one data line is not overlapped with a pixel electrode which is connected with a data line adjacent to the one data line.

4. The thin film transistor array panel of claim 1, further comprising:
a passivation layer between the pixel electrodes and one data line in a cross-section of the insulating substrate,
wherein the passivation layer includes an organic insulator.

5. The thin film transistor array panel of claim 4, wherein the passivation layer has a thickness of 2 micrometers or more.

6. The thin film transistor array panel of claim 1, wherein the pixel electrodes are linearly arranged in the columns extending in the column direction.

7. The thin film transistor array panel of claim 1, further comprising:
a sustain electrode overlapped with the one data line, and having a width in the row direction larger than a width of the one data line.

8. The thin film transistor array panel of claim 7, further comprising:
a passivation layer between the pixel electrodes and the one data line in a cross-section of the insulating substrate,
wherein the passivation layer includes an organic insulator.

9. A thin film transistor array panel, comprising:
an insulating substrate;
a single unitary indivisible pixel electrode, including a first subpixel electrode, and a second subpixel electrode on the insulating substrate;
a thin film transistor directly connected with the first subpixel electrode or the second subpixel electrode of the pixel electrode;
a gate line and a data line connected with the thin film transistor; and a passivation layer between the pixel electrode and the data line in a cross-section of the insulating substrate,
wherein
the passivation layer includes an organic insulator,
the first subpixel electrode and the second subpixel electrode are positioned in a diagonal direction relative to the data line in a plan view of the thin film transistor array panel; and
the first subpixel electrode and the second subpixel electrode are connected to each other by a connector crossing the data line.

10. The thin film transistor array panel of claim 9, wherein the first subpixel electrode and the second subpixel electrode connected by the connector are of a same color, and overlap color filters of the same color.

11. The thin film transistor array panel of claim 10, wherein the first subpixel electrode and the second subpixel electrode connected by the connector, and two subpixel electrodes not connected with the connector and diagonally adjacent to each other relative to the connector, constitute an electrode group, and
the two subpixel electrodes which are not connected with the connector in the electrode group, correspond to different colors.

12. The thin film transistor array panel of claim 11, wherein:
the first subpixel electrode and the second subpixel electrode connected by the connector overlap with one of red, green, and blue color filters, and
the two subpixel electrodes which are not connected by the connector correspond to the remaining two color filters, other than the color filter corresponding to the first subpixel electrode and the second subpixel electrode connected by the connector.

13. The thin film transistor array panel of claim 9, wherein:
the passivation layer has a thickness of 2 micrometers or more.

14. The thin film transistor array panel of claim 9, further comprising:
a sustain electrode line between the first subpixel electrode and the second subpixel electrode in the plan view.

15. The thin film transistor array panel of claim 14, further comprising:
the sustain electrode overlapped with the data line, and having a width larger than a width of the data line, the widths taken perpendicular to a longitudinal direction of the data line.

16. The thin film transistor array panel of claim 14, wherein:
the first subpixel electrode and the second subpixel electrode connected by the connector are of a same color and overlap color filters of the same color.

17. A thin film transistor array panel comprising:
an insulating substrate;
a plurality of pixel electrodes arranged on the insulating substrate in rows extending in a row direction, and columns extending in a column direction;
a plurality of thin film transistors connected with the plurality of pixel electrodes, respectively; and
a plurality of gate lines extending in the row direction, and a plurality of data lines extending in the column direction and connected with the plurality of thin film transistors;
wherein
two pixel electrodes in adjacent rows of one column define an electrode group;
a connected data line is connected to the two pixel electrodes in a first electrode group in a first column by respective first thin film transistors, and connected to the two pixel electrodes in a second electrode group in a second column adjacent to the first column by respective second thin film transistors;
the first thin film transistors are on an opposite side of the second thin film transistors, with respect to the connected data line; and
a length of the pixel electrodes in the first and second electrode groups, taken in the column direction, is overlapped with the data line.

* * * * *